United States Patent
Xu

(10) Patent No.: US 9,312,276 B2
(45) Date of Patent: Apr. 12, 2016

(54) METHOD FOR MANUFACTURING ARRAY SUBSTRATE

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 54 days.

(21) Appl. No.: 14/374,254

(22) PCT Filed: Apr. 17, 2014

(86) PCT No.: PCT/CN2014/075574
§ 371 (c)(1),
(2) Date: Jul. 24, 2014

(87) PCT Pub. No.: WO2015/143745
PCT Pub. Date: Oct. 1, 2015

(65) Prior Publication Data
US 2015/0279863 A1    Oct. 1, 2015

(30) Foreign Application Priority Data
Mar. 28, 2014    (CN) .......................... 2014 1 0121807

(51) Int. Cl.
*H01L 21/00*    (2006.01)
*H01L 21/84*    (2006.01)
*H01L 27/12*    (2006.01)
*H01L 27/32*    (2006.01)
*H01L 51/56*    (2006.01)

(52) U.S. Cl.
CPC .......... *H01L 27/1222* (2013.01); *H01L 27/127* (2013.01); *H01L 27/1218* (2013.01); *H01L 27/1288* (2013.01); *H01L 27/3246* (2013.01); *H01L 51/56* (2013.01); *H01L 2227/323* (2013.01)

(58) Field of Classification Search
CPC . H01L 27/1222; H01L 27/1218; H01L 51/56; H01L 27/127; H01L 27/3246; H01L 27/1288
See application file for complete search history.

(56) References Cited

U.S. PATENT DOCUMENTS

| | | | | |
|---|---|---|---|---|
| 6,337,284 B1* | 1/2002 | Hwang | ............. | H01L 29/66765 257/247 |
| 7,795,081 B2* | 9/2010 | Liu | ....................... | H01L 27/1214 257/E21.028 |
| 2002/0063825 A1* | 5/2002 | Sakurai | ............. | G02F 1/133553 349/113 |
| 2008/0003726 A1* | 1/2008 | Park | .................... | H01L 27/1288 438/149 |

* cited by examiner

*Primary Examiner* — Stephen W Smoot
*Assistant Examiner* — Vicki B Booker
(74) *Attorney, Agent, or Firm* — Andrew C. Cheng

(57) ABSTRACT

A method for manufacturing an array substrate for producing an amorphous silicon (a-Si) array substrate of a low-definition OLED display is provided. The method includes: patterning a gate metal and a pixel electrode on a glass substrate by using a first mask which is a first half tone mask; patterning a gate insulation layer and a semiconductor layer on the glass substrate with a second mask which is a second half tone mask; forming source/drain metallic layers and a channel with a third mask; and forming a bank layer with a fourth mask. The a-Si array substrates of low-definition OLED display panels undertake less manufacturing processes, which means that mask plates are used less and cost is reduced.

19 Claims, 3 Drawing Sheets

METHOD FOR MANUFACTURING ARRAY SUBSTRATE

CROSS REFERENCE TO RELATED APPLICATION

The present application is based on, and claims priority from, Chinese application number 201410121807.0, filed Mar. 28, 2014, the disclosure of which is hereby incorporated by reference herein in its entirety.

BACKGROUND OF THE INVENTION

1. Field of the Invention

The present invention relates to manufacturing technology of organic light-emitting diode (OLED) displays, and more especially, to a method for manufacturing array substrates for producing thin film transistor (TFT) array substrates of OLED displays.

2. Description of the Prior Art

Display technology has been developed fast for years. Flat displays have replaced bulky cathode ray tube (CRT) displays and become part of our daily lives. A commonly used flat display comprises a liquid crystal display (LCD) and an OLED display. The above-mentioned flat displays have merits of small size, low power consumption, and no radiation, so the flat displays are leaders in the market. Each pixel on the array substrate of the flat display comprises a switch for controlling the pixel itself. The switch is a thin film transistor (TFT). The TFT comprises at least a gate electrode, a source, a drain, a gate insulation layer, and an active layer. Each of the pixels is independently controlled by a driving circuit so that each of the pixels does not cause crosstalk to each other.

Low temperature poly-silicon (LTPS) array substrates are often adopted in traditional high-definition (HD) OLEDs. LTPS array substrates undergo 9 to 13 masks. It is more complicated to process LTPS array substrates.

However, it is not recommendable that amorphous silicon (a-Si) array substrates of low-definition (LD) panels undergo 9 to 13 masks that LTPS array substrates undergo since the processes are complicated and cost is high.

SUMMARY OF THE INVENTION

The present invention is to propose a method for manufacturing an array substrate. The manufacturing method facilitates reduction of use of mask plates, thereby reducing production cost. The manufacturing method is suitable to manufacture a-Si array substrates of low-definition OLED display panels.

According to the present invention, a method for manufacturing an array substrate for producing an amorphous silicon (a-Si) array substrate of a low-definition organic light emitting diode (OLED) display is provided. The method comprises:

patterning a gate metal and a pixel electrode on a glass substrate by using a first mask which is a first half tone mask;

patterning a gate insulation layer and a semiconductor layer on the glass substrate with a second mask which is a second half tone mask;

forming source/drain metallic layers and a channel with a third mask; and forming a bank layer with a fourth mask.

In one aspect of the present invention, the step of patterning a gate metal and a pixel electrode on a glass substrate with a first mask which is a first half tone mask comprises:

depositing a pixel electrode layer and a gate metallic layer on the glass substrate, and coating a first photoresist on the pixel electrode layer and the gate metallic layer;

exposing and developing the first photoresist with the first half tone mask;

wet-etching the gate metallic layer and the pixel electrode layer, and removing part of the first photoresist; and wet-etching the gate metallic layer again and lifting off the first photoresist, to pattern the gate metal and the pixel electrode.

In another aspect of the present invention, the step of depositing a pixel electrode layer and a gate metallic layer on the glass substrate comprises:

sputtering or thermal evaporating an indium tin oxide (ITO) pixel electrode layer or an indium zinc oxide (IZO) pixel electrode layer having a thickness of from 100 Å to 1000 Å and the gate metallic layer having a thickness of from 1000 Å to 6000 Å on the glass substrate.

In another aspect of the present invention, the step of patterning a gate insulation layer and a semiconductor layer on the glass substrate with a second mask which is a second half tone mask comprises:

depositing a gate insulation layer and a semiconductor layer on the glass substrate with the gate metal and the pixel electrode, and coating a second photoresist on the gate insulation layer and the semiconductor layer;

exposing and developing the second photoresist with the second half tone mask;

dry-etching an insulation protection layer on the channel and the semiconductor layer, and removing part of the second photoresist; and dry-etching the semiconductor layer again and lifting off the second photoresist, to pattern the gate insulation layer and the semiconductor layer.

In another aspect of the present invention, the step of depositing a gate insulation layer and a semiconductor layer on the glass substrate with the gate metal and the pixel electrode comprises:

using chemical vapor deposition (CVD) to sequentially deposit the gate insulation layer having a thickness of from 2000 Å to 5000 Å and the semiconductor layer having a thickness of from 1000 Å to 3000 Å on the glass substrate.

In another aspect of the present invention, the step of forming the source/drain metallic layers and the channel with the third mask comprises:

depositing a source/drain metallic film on the glass substrate on which the gate insulation layer and the semiconductor layer are patterned, and coating a third photoresist;

exposing and developing the source/drain metallic film with the third mask, wet-etching the source/drain metallic layers, dry-etching the channel, and lifting off the third photoresist to form the source metallic layer, the drain metallic layer, and the channel.

In another aspect of the present invention, the step of depositing a source/drain metallic film on the glass substrate on which the gate insulation layer and the semiconductor layer are patterned comprises:

using magnetron sputtering or thermal evaporation to deposit the source/drain metallic film having a thickness of from 1000 Å to 6000 Å.

In another aspect of the present invention, the step of forming the bank layer with the fourth mask comprises:

depositing the bank layer on the glass substrate on which the source metallic layer, the drain metallic layer, and the channel are formed, and coating a fourth photoresist;

exposing, developing, and dry-etching the bank layer with the fourth mask, to pattern the bank layer; and lifting off the fourth photoresist.

In still another aspect of the present invention, the step of depositing the layer of the bank layer on the glass substrate on which the source metallic layer, the drain metallic layer, and the channel are formed comprises:

conducting the CVD for depositing the bank layer on the glass substrate on which the source metallic layer, the drain metallic layer, and the channel are formed, and forming the bank layer having a thickness of from 1000 Å to 3000 Å.

In yet another aspect of the present invention, the CVD is plasma enhanced chemical vapor deposition (PECVD), the gate insulation layer and the bank layer is made from SiNx, and the semiconductor layer is an a-Si semiconductor layer.

According to the present invention, a method for manufacturing an array substrate for producing an amorphous silicon (a-Si) array substrate of a low-definition organic light emitting diode (OLED) display is provided. The method comprises:

patterning a gate metal and a pixel electrode on a glass substrate by using a first mask which is a first half tone mask;

patterning a gate insulation layer and a semiconductor layer on the glass substrate with a second mask which is a second half tone mask;

forming source/drain metallic layers and a channel with a third mask; and forming a bank layer with a fourth mask;

wherein the step of patterning a gate metal and a pixel electrode on a glass substrate with a first mask which is a first half tone mask comprises:

depositing a pixel electrode layer and a gate metallic layer on the glass substrate, and coating a first photoresist on the pixel electrode layer and the gate metallic layer;

exposing and developing the first photoresist with the first half tone mask;

wet-etching the gate metallic layer and the pixel electrode layer, and removing part of the first photoresist;

wet-etching the gate metallic layer again and lifting off the first photoresist, to pattern the gate metal and the pixel electrode.

In one aspect of the present invention, the step of depositing a pixel electrode layer and a gate metallic layer on the glass substrate comprises:

sputtering or thermal evaporating an indium tin oxide (ITO) pixel electrode layer or an indium zinc oxide (IZO) pixel electrode layer having a thickness of from 100 Å to 1000 Å and the gate metallic layer having a thickness of from 1000 Å to 6000 Å on the glass substrate.

In another aspect of the present invention, the step of patterning a gate insulation layer and a semiconductor layer on the glass substrate with a second mask which is a second half tone mask comprises:

depositing a gate insulation layer and a semiconductor layer on the glass substrate with the gate metal and the pixel electrode, and coating a second photoresist on the gate insulation layer and the semiconductor layer;

exposing and developing the second photoresist with the second half tone mask;

dry-etching an insulation protection layer on the channel and the semiconductor layer, and removing part of the second photoresist; and dry-etching the semiconductor layer again and lifting off the second photoresist, to pattern the gate insulation layer and the semiconductor layer.

In another aspect of the present invention, the step of depositing a gate insulation layer and a semiconductor layer on the glass substrate with the gate metal and the pixel electrode comprises:

using chemical vapor deposition (CVD) to sequentially deposit the gate insulation layer having a thickness of from 2000 Å to 5000 Å and the semiconductor layer having a thickness of from 1000 Å to 3000 Å on the glass substrate.

In another aspect of the present invention, the step of forming the source/drain metallic layers and the channel with the third mask comprises:

depositing a source/drain metallic film on the glass substrate on which the gate insulation layer and the semiconductor layer are patterned, and coating a third photoresist;

exposing and developing the source/drain metallic film with the third mask, wet-etching the source/drain metallic layers, dry-etching the channel, and lifting off the third photoresist to form the source metallic layer, the drain metallic layer, and the channel.

In another aspect of the present invention, the step of depositing a source/drain metallic film on the glass substrate on which the gate insulation layer and the semiconductor layer are patterned comprises:

using magnetron sputtering or thermal evaporation to deposit the source/drain metallic film having a thickness of from 1000 Å to 6000 Å.

In another aspect of the present invention, the step of forming the bank layer with the fourth mask comprises:

depositing the bank layer on the glass substrate on which the source metallic layer, the drain metallic layer, and the channel are formed, and coating a fourth photoresist;

exposing, developing, and dry-etching the bank layer with the fourth mask, to pattern the bank layer; and lifting off the fourth photoresist.

In still another aspect of the present invention, the step of depositing the layer of the bank layer on the glass substrate on which the source metallic layer, the drain metallic layer, and the channel are formed comprises:

conducting the CVD for depositing the bank layer on the glass substrate on which the source metallic layer, the drain metallic layer, and the channel are formed, and forming the bank layer having a thickness of from 1000 Å to 3000 Å.

In yet another aspect of the present invention, the CVD is plasma enhanced chemical vapor deposition (PECVD), the gate insulation layer and the bank layer is made from SiNx, and the semiconductor layer is an a-Si semiconductor layer.

The embodiments of the present invention bring benefits as follows:

Only four masks are conducted in the embodiment of the present invention. The a-Si array substrates of low-definition OLED display panels undergo less manufacturing processes, which means that mask plates are used less and cost is reduced.

BRIEF DESCRIPTION OF THE DRAWINGS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

DETAILED DESCRIPTION OF THE PREFERRED EMBODIMENTS

The accompanying drawings are included to provide a further understanding of the invention. The drawings illustrate embodiments of the invention and, together with the description, serve to explain the principles of the invention.

Figure 1:
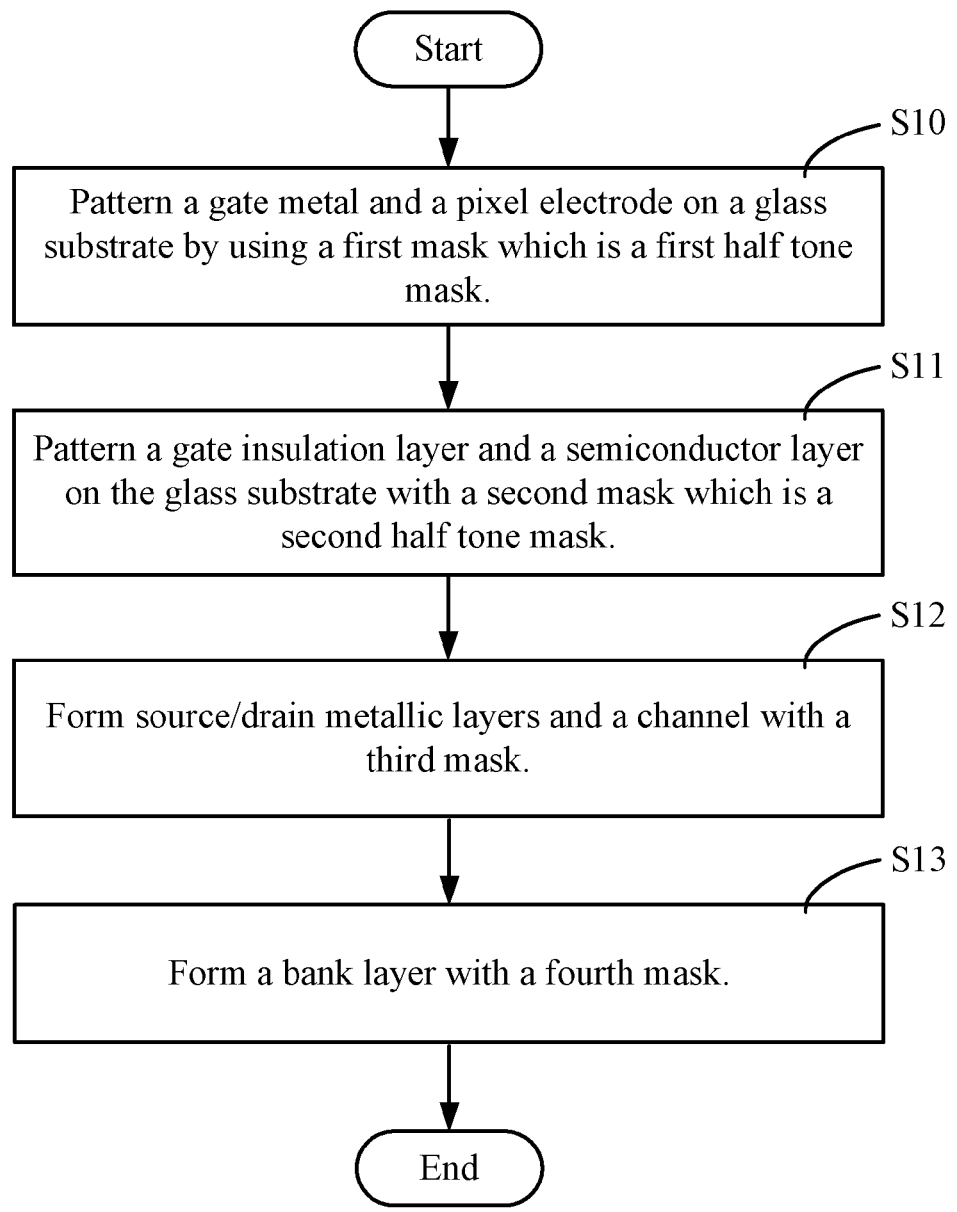
FIG. 1 shows a flow chart of a method for manufacturing an array substrate according one embodiment of the present invention.

Refer to FIG. 1 showing a flow chart of a method for manufacturing an array substrate according one embodiment of the present invention. An a-Si array substrate of a low-definition OLED display panel can be produced with the method proposed by the embodiment. The method comprises following steps:

Step S10: patterning a gate metal and a pixel electrode on a glass substrate with a first mask which is a first half tone mask.

Specifically, the step comprises:

depositing the pixel electrode layer and the gate metallic layer on the glass substrate, predetermining thickness of the pixel electrode layer and thickness of the gate metallic layer, coating a first photoresist on the pixel electrode layer and the gate metallic layer, for example, conducting sputtering or thermal evaporation in one embodiment to deposit the gate metallic layer and an indium tin oxide (ITO) pixel electrode layer or an indium zinc oxide (IZO) pixel electrode layer on the glass substrate; forming thickness of the gate metallic layer to be 1000 Å to 6000 Å, forming a thickness of the ITO or IZO pixel electrode layer to be 100 Å to 1000 Å, and using chromium (Cr), molybdenum (Mo), aluminum (Al), or copper (Cu) to make the gate metallic layer chromium (Cr), molybdenum (Mo), aluminum (Al), or copper (Cu);

exposing and developing the first photoresist with the half tone mask;

wet-etching the gate metallic layer the first time, wet-etching the pixel electrode layer, removing part of the first photoresist, wet-etching the gate metallic layer the second time, lifting off the first photoresist, patterning the gate metallic layer and the pixel electrode layer, the gate metallic layer comprising a gate and a gate pad.

Figure 2:
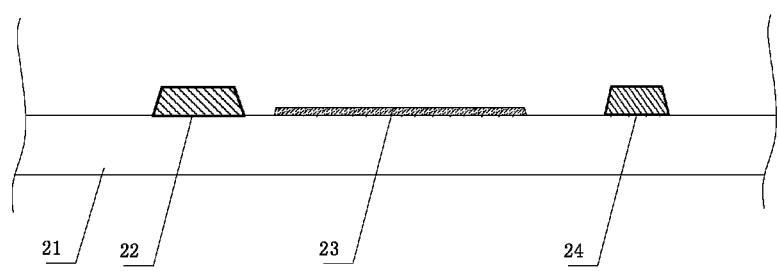
FIG. 2 shows a structure diagram of the array substrate after a gate metallic layer and a pixel electrode are formed by using a first mask.

Refer to FIG. 2 showing a schematic diagram of the structure of the array substrate where the gate metallic layer and the pixel electrode layer are formed. Specifically, the array substrate comprises the glass substrate 21, the gate 22, the pixel electrode 23, and the gate pad 24. The gate 22, the pixel electrode 23, and the gate pad 24 are formed on the glass substrate 21.

Step S11: patterning a gate insulation layer and a semiconductor layer with a second mask with the second mask which is the half tone mask.

Specifically, the step comprises:

forming the gate insulation layer with predetermined thickness and the semiconductor layer with predetermined thickness on the glass substrate on which the gate metallic layer and the pixel electrode layer are patterned, and coating a second photoresist, for example, conducting chemical vapor deposition (CVD) in one embodiment, subsequently depositing the gate insulation layer and the semiconductor layer on the glass substrate on which the gate metallic layer and the pixel electrode layer are patterned, forming the thickness of the gate insulation layer to be 2000 Å to 5000 Å, forming the thickness of the semiconductor layer to be 1000 Å to 3000 Å;

exposing and developing the second photoresist with the half tone mask to form a specific pattern;

dry-etching an insulation protection layer on a channel, dry-etching the semiconductor layer the first time, removing part of the second photoresist, dry-etching the semiconductor layer the second time, lifting off the second photoresist, patterning the gate insulation layer and the semiconductor layer.

Figure 3:
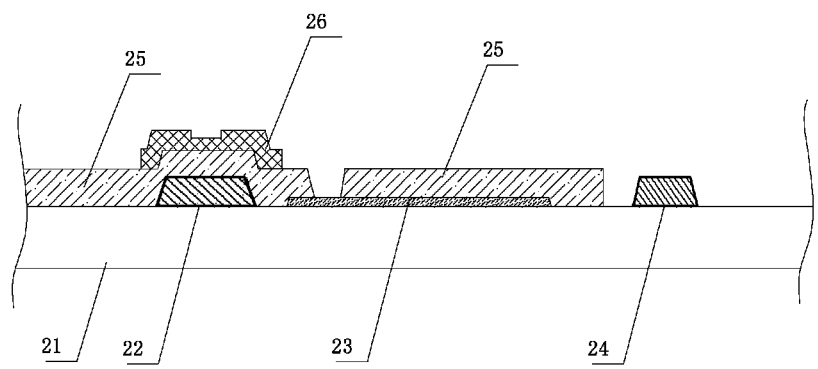
FIG. 3 shows a structure diagram of the array substrate after a gate insulation layer and an a-Si semiconductor layer are formed by using a second mask.

FIG. 3 shows a diagram of the structure of the array substrate after the pattern of the gate insulation layer and the pattern of the semiconductor layer are formed. The gate insulation layer is labeled 25. The semiconductor layer is labeled 26. Other components are also labeled as shown in FIG. 2.

Step S12: forming source/drain metallic layers and the channel with a third mask which can be an ordinary mask;

forming the source/drain metallic layers with predetermined thickness on the glass substrate on which the gate insulation layer and the semiconductor layer are patterned, coating a third photoresist, for example, conducting magnetron sputtering or thermal evaporation in one embodiment, forming thickness of the source/drain metallic layers to be 1000 Å to 6000 Å;

exposing and developing the source/drain metallic layers with the third mask, wet-etching the source/drain metallic layers, dry-etching the channel, lifting off the third photoresist to form a source metallic layer, a drain metallic layer, the channel, and a data pad.

Figure 4:
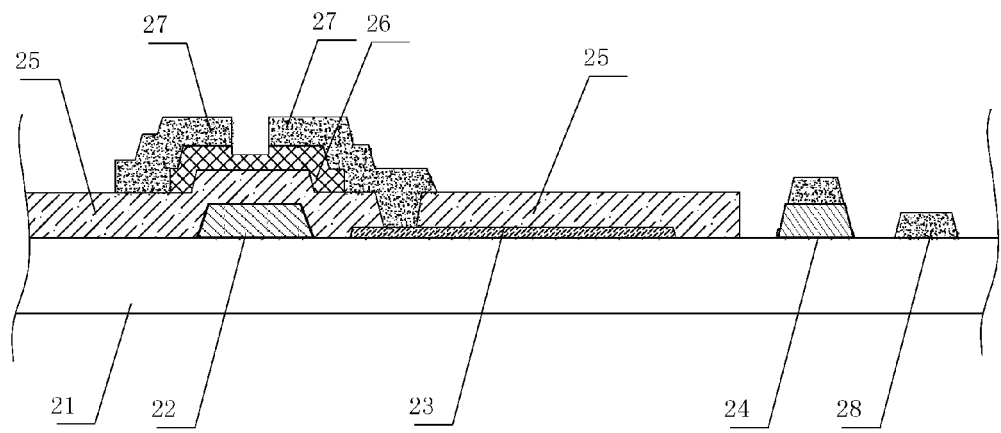
FIG. 4 shows a structure diagram of the array substrate after a source/drain layers are formed by using a third mask.

FIG. 4 shows a diagram of the structure of the array substrate after the source/drain metallic layers are formed on the array substrate. The source/drain metallic layers are labeled as 27. The data pad is labeled as 28. Other components are also labeled as shown in FIG. 3.

Step S14: forming a bank layer with a fourth mask.

Specifically, the step comprises:

depositing a layer of the bank layer on the glass substrate on which the source metallic layer, the drain metallic layer, and the channel are formed, coating a fourth photoresist, for example, conducting CVD in one embodiment, depositing a layer of the bank layer on the glass substrate on which the source metallic layer, the drain metallic layer, and the channel are formed, forming thickness of the bank layer to be 1000 Å to 3000 Å;

exposing, developing, and dry-etching the bank layer with a fourth mask to form a pattern;

lifting off the fourth photoresist.

Figure 5:
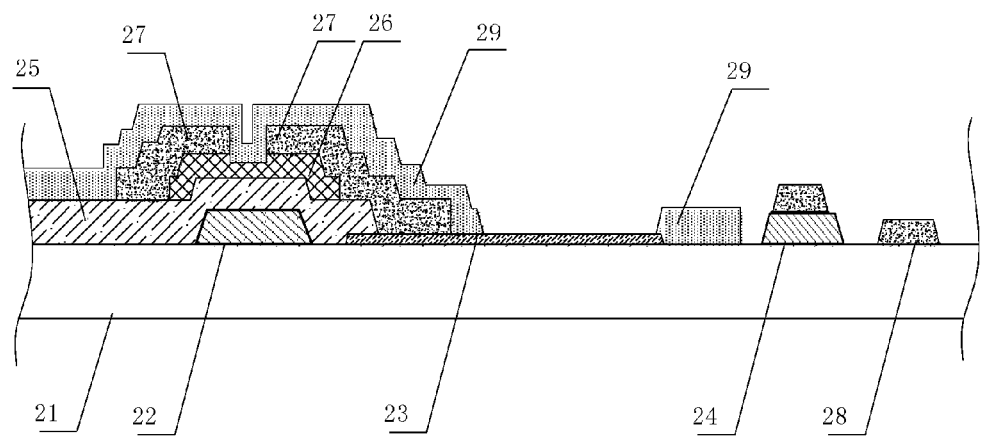
FIG. 5 shows a structure diagram of the array substrate after a bank layer is formed by using a fourth mask.

FIG. 5 shows a diagram of the structure of the array substrate after the bank layer is formed. The bank layer is labeled as 29. Other components are also labeled as shown in FIG. 4.

Specifically, the above-mentioned CVD is plasma enhanced chemical vapor deposition (PECVD). The gate insulation layer and the bank layer are made from SiNx. The semiconductor layer is an a-Si semiconductor layer.

The embodiments of the present invention bring benefits as follows:

Only four masks are conducted in the embodiment of the present invention. The a-Si array substrates of low-definition OLED display panels undertake less manufacturing processes, which means that mask plates are used less and cost is reduced.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A method for manufacturing an array substrate for producing an amorphous silicon (a-Si) array substrate of a low-definition organic light emitting diode (OLED) display, comprising:
    patterning a gate metal and a pixel electrode on a glass substrate by using a first mask which is a first half tone mask;
    patterning a gate insulation layer and a semiconductor layer on the glass substrate with a second mask which is a second half tone mask;
    forming source/drain metallic layers and a channel with a third mask; and
    forming a bank layer with a fourth mask.

2. The method as claimed in claim 1, wherein the step of patterning a gate metal and a pixel electrode on a glass substrate with a first mask which is a first half tone mask comprises:
    depositing a pixel electrode layer and a gate metallic layer on the glass substrate, and coating a first photoresist on the pixel electrode layer and the gate metallic layer;
    exposing and developing the first photoresist with the first half tone mask;
    wet-etching the gate metallic layer and the pixel electrode layer, and removing part of the first photoresist;
    wet-etching the gate metallic layer again and lifting off the first photoresist, to pattern the gate metal and the pixel electrode.

3. The method as claimed in claim 2, wherein the step of depositing a pixel electrode layer and a gate metallic layer on the glass substrate comprises:
    sputtering or thermal evaporating an indium tin oxide (ITO) pixel electrode layer or an indium zinc oxide (IZO) pixel electrode layer having a thickness of from 100 Å to 1000 Å and the gate metallic layer having a thickness of from 1000 Å to 6000 Å on the glass substrate.

4. The method as claimed in claim 3, wherein the step of patterning a gate insulation layer and a semiconductor layer on the glass substrate with a second mask which is a second half tone mask comprises:
    depositing a gate insulation layer and a semiconductor layer on the glass substrate with the gate metal and the pixel electrode, and coating a second photoresist on the gate insulation layer and the semiconductor layer;
    exposing and developing the second photoresist with the second half tone mask;
    dry-etching an insulation protection layer on the channel and the semiconductor layer, and removing part of the second photoresist; and
    dry-etching the semiconductor layer again and lifting off the second photoresist, to pattern the gate insulation layer and the semiconductor layer.

5. The method as claimed in claim 4, wherein the step of depositing a gate insulation layer and a semiconductor layer on the glass substrate with the gate metal and the pixel electrode comprises:
    using chemical vapor deposition (CVD) to sequentially deposit the gate insulation layer having a thickness of from 2000 Å to 5000 Å and the semiconductor layer having a thickness of from 1000 Å to 3000 Å on the glass substrate.

6. The method as claimed in claim 5, wherein the step of forming the source/drain metallic layers and the channel with the third mask comprises:
    depositing a source/drain metallic film on the glass substrate on which the gate insulation layer and the semiconductor layer are patterned, and coating a third photoresist;
    exposing and developing the source/drain metallic film with the third mask, wet-etching the source/drain metallic layers, dry-etching the channel, and lifting off the third photoresist to form the source metallic layer, the drain metallic layer, and the channel.

7. The method as claimed in claim 6, wherein the step of depositing a source/drain metallic film on the glass substrate on which the gate insulation layer and the semiconductor layer are patterned comprises:
    using magnetron sputtering or thermal evaporation to deposit the source/drain metallic film having a thickness of from 1000 Å to 6000 Å.

8. The method as claimed in claim 7, wherein the step of forming the bank layer with the fourth mask comprises:
    depositing the bank layer on the glass substrate on which the source metallic layer, the drain metallic layer, and the channel are formed, and coating a fourth photoresist;
    exposing, developing, and dry-etching the bank layer with the fourth mask, to pattern the bank layer; and
    lifting off the fourth photoresist.

9. The method as claimed in claim 8, wherein the step of depositing the layer of the bank layer on the glass substrate on which the source metallic layer, the drain metallic layer, and the channel are formed comprises:
    using chemical vapor deposition (CVD) for depositing the bank layer on the glass substrate on which the source metallic layer, the drain metallic layer, and the channel are formed, and forming the bank layer having a thickness of from 1000 Å to 3000 Å.

10. The method as claimed in claim 9, wherein
    the CVD is plasma enhanced chemical vapor deposition (PECVD), the gate insulation layer and the bank layer is made from SiNx, and the semiconductor layer is an a-Si semiconductor layer.

11. A method for manufacturing an array substrate for producing an amorphous silicon (a-Si) array substrate of a low-definition organic light emitting diode (OLED) display, comprising:
    patterning a gate metal and a pixel electrode on a glass substrate by using a first mask which is a first half tone mask;
    patterning a gate insulation layer and a semiconductor layer on the glass substrate with a second mask which is a second half tone mask;
    forming source/drain metallic layers and a channel with a third mask; and
    forming a bank layer with a fourth mask;
    wherein the step of patterning a gate metal and a pixel electrode on a glass substrate with a first mask which is a first half tone mask comprises:
    depositing a pixel electrode layer and a gate metallic layer on the glass substrate, and coating a first photoresist on the pixel electrode layer and the gate metallic layer;
    exposing and developing the first photoresist with the first half tone mask;
    wet-etching the gate metallic layer and the pixel electrode layer, and removing part of the first photoresist;
    wet-etching the gate metallic layer again and lifting off the first photoresist, to pattern the gate metal and the pixel electrode.

12. The method as claimed in claim 11, wherein the step of depositing a pixel electrode layer and a gate metallic layer on the glass substrate comprises:

sputtering or thermal evaporating an indium tin oxide (ITO) pixel electrode layer or an indium zinc oxide (IZO) pixel electrode layer having a thickness of from 100 Å to 1000 Å and the gate metallic layer having a thickness of from 1000 Å to 6000 Å on the glass substrate.

13. The method as claimed in claim 12, wherein the step of patterning a gate insulation layer and a semiconductor layer on the glass substrate with a second mask which is a second half tone mask comprises:

depositing a gate insulation layer and a semiconductor layer on the glass substrate with the gate metal and the pixel electrode, and coating a second photoresist on the gate insulation layer and the semiconductor layer;

exposing and developing the second photoresist with the second half tone mask;

dry-etching an insulation protection layer on the channel and the semiconductor layer, and removing part of the second photoresist; and dry-etching the semiconductor layer again and lifting off the second photoresist, to pattern the gate insulation layer and the semiconductor layer.

14. The method as claimed in claim 13, wherein the step of depositing a gate insulation layer and a semiconductor layer on the glass substrate with the gate metal and the pixel electrode comprises:

using chemical vapor deposition (CVD) to sequentially deposit the gate insulation layer having a thickness of from 2000 Å to 5000 Å and the semiconductor layer having a thickness of from 1000 Å to 3000 Å on the glass substrate.

15. The method as claimed in claim 14, wherein the step of forming the source/drain metallic layers and the channel with the third mask comprises:

depositing a source/drain metallic film on the glass substrate on which the gate insulation layer and the semiconductor layer are patterned, and coating a third photoresist;

exposing and developing the source/drain metallic film with the third mask, wet-etching the source/drain metallic layers, dry-etching the channel, and lifting off the third photoresist to form the source metallic layer, the drain metallic layer, and the channel.

16. The method as claimed in claim 15, wherein the step of depositing a source/drain metallic film on the glass substrate on which the gate insulation layer and the semiconductor layer are patterned comprises:

using magnetron sputtering or thermal evaporation to deposit the source/drain metallic film having a thickness of from 1000 Å to 6000 Å.

17. The method as claimed in claim 16, wherein the step of forming the bank layer with the fourth mask comprises:

depositing the bank layer on the glass substrate on which the source metallic layer, the drain metallic layer, and the channel are formed, and coating a fourth photoresist;

exposing, developing, and dry-etching the bank layer with the fourth mask, to pattern the bank layer; and lifting off the fourth photoresist.

18. The method as claimed in claim 17, wherein the step of depositing the layer of the bank layer on the glass substrate on which the source metallic layer, the drain metallic layer, and the channel are formed comprises:

using chemical vapor deposition (CVD) for depositing the bank layer on the glass substrate on which the source metallic layer, the drain metallic layer, and the channel are formed, and forming the bank layer having a thickness of from 1000 Å to 3000 Å.

19. The method as claimed in claim 18, wherein the CVD is plasma enhanced chemical vapor deposition (PECVD), the gate insulation layer and the bank layer is made from SiNx, and the semiconductor layer is an a-Si semiconductor layer.

* * * * *